(12) United States Patent
Terzioglu

(10) Patent No.: US 8,058,928 B2
(45) Date of Patent: Nov. 15, 2011

(54) OPERATIONAL AMPLIFIER FOR AN ACTIVE PIXEL SENSOR

(75) Inventor: Esin Terzioglu, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/461,950

(22) Filed: Aug. 28, 2009

(65) Prior Publication Data

US 2009/0322920 A1 Dec. 31, 2009

Related U.S. Application Data

(63) Continuation of application No. 11/192,372, filed on Jul. 29, 2005, now Pat. No. 7,605,854.

(60) Provisional application No. 60/600,387, filed on Aug. 11, 2004.

(51) Int. Cl.
*H03F 1/14* (2006.01)
(52) U.S. Cl. ........................................ 330/107; 330/292
(58) Field of Classification Search .................. 330/107, 330/260, 292
See application file for complete search history.

(56) References Cited

U.S. PATENT DOCUMENTS

| | | | | |
|---|---|---|---|---|
| 4,500,846 A * | 2/1985 | Lewyn et al. | .................. | 330/253 |
| 5,781,233 A | 7/1998 | Liang et al. | | |
| 5,825,250 A * | 10/1998 | Tomasini et al. | ............. | 330/292 |
| 6,163,029 A | 12/2000 | Yamada et al. | | |
| 6,218,656 B1 | 4/2001 | Guidash | | |
| 6,356,220 B1 | 3/2002 | Takatsu | | |
| 6,407,636 B1 * | 6/2002 | Goutti | ........................... | 330/255 |
| 6,486,808 B1 | 11/2002 | Seppi et al. | | |
| 6,576,883 B1 | 6/2003 | McCoy | | |
| 6,737,706 B2 | 5/2004 | Lee et al. | | |
| 6,747,264 B2 | 6/2004 | Miida | | |
| 7,002,408 B2 | 2/2006 | Roos et al. | | |
| 7,005,626 B2 | 2/2006 | Chan et al. | | |
| 7,015,841 B2 | 3/2006 | Yoshida et al. | | |
| 7,129,985 B1 | 10/2006 | Koizumi et al. | | |
| 7,145,188 B2 | 12/2006 | Terzioglu et al. | | |
| 7,199,662 B2 * | 4/2007 | Seko | ............................. | 330/261 |

(Continued)

FOREIGN PATENT DOCUMENTS

CN 1437262 A 8/2003

(Continued)

OTHER PUBLICATIONS

European Search Report dated Jul. 30, 2008.

(Continued)

*Primary Examiner* — Steven J Mottola
(74) *Attorney, Agent, or Firm* — Sterne, Kessler, Goldstein & Fox P.L.L.C.

(57) ABSTRACT

The present invention includes operational amplifier for an active pixel sensor that detects optical energy and generates an analog output that is proportional to the optical energy. The active pixel sensor operates in a number of different modes including: signal integration mode, the reset integration mode, column reset mode, and column signal readout mode. Each mode causes the operational amplifier to see a different output load. Accordingly, the operational amplifier includes a variable feedback circuit to provide compensation that provides sufficient amplifier stability for each operating mode of the active pixel sensor. For instance, the operational amplifier includes a bank of feedback capacitors, one or more of which are selected based on the operating mode to provide sufficient phase margin for stability, but also considering gain and bandwidth requirements of the operating mode.

20 Claims, 12 Drawing Sheets

U.S. PATENT DOCUMENTS

| | | |
|---|---|---|
| 7,333,043 B2 | 2/2008 | Terzioglu et al. |
| 7,605,854 B2 | 10/2009 | Terzioglu |
| 2001/0021567 A1 | 9/2001 | Takahashi |
| 2002/0134918 A1 | 9/2002 | Miida |
| 2003/0063026 A1 | 4/2003 | Nandy |
| 2003/0138985 A1 | 7/2003 | Rhodes |
| 2003/0156211 A1 | 8/2003 | Mizuno et al. |
| 2004/0016919 A1 | 1/2004 | Daiku et al. |
| 2004/0080637 A1 | 4/2004 | Nakamura et al. |
| 2004/0201766 A1 | 10/2004 | Funston et al. |
| 2004/0239421 A1 | 12/2004 | Wang et al. |
| 2005/0180747 A1 | 8/2005 | Wang |
| 2005/0200510 A1 | 9/2005 | Yoshida et al. |
| 2006/0027733 A1 | 2/2006 | Terzioglu et al. |
| 2006/0049438 A1 | 3/2006 | Terzioglu |
| 2007/0096161 A1 | 5/2007 | Terzioglu et al. |

FOREIGN PATENT DOCUMENTS

| | | |
|---|---|---|
| CN | 1477862 A | 2/2004 |

OTHER PUBLICATIONS

Notice of Allowance, dated Jun. 11, 2009, for U.S. Appl. No. 11/192,372, filed Jul. 29, 2005, 11 pages.

Office Communication, dated Oct. 29, 2008, for U.S. Appl. No. 11/192,372, filed Jul. 29, 2005, 14 pages.

* cited by examiner

US 8,058,928 B2

OPERATIONAL AMPLIFIER FOR AN ACTIVE PIXEL SENSOR

CROSS REFERENCE TO RELATED APPLICATIONS

This application is a continuation of U.S. Non-Provisional patent application Ser. No. 11/192,372 (now U.S. Pat. No. 7,605,854), filed Jul. 29, 2005, which claims the benefit of U.S. Provisional Patent Application No. 60/600,387, filed on Aug. 11, 2004, both of which are incorporated herein by reference in their entirety.

BACKGROUND OF THE INVENTION

1. Field of the Invention

The present invention generally relates an operational amplifier for image processing on a semiconductor circuit, and more specifically to an operational amplifier having selectable compensation feedback to insure stability for various modes of image processing.

2. Background Art

Conventional digital imaging devices, such as a digital camera or an optical mouse, utilize a photo-diode or an array of photo diodes to capture and record optical energy. The photo-diode converts optical energy to electrical energy (voltage or current) that can later be digitized and further processed.

The sensitivity of the photo-diode is limited by the "dark current" that is generated by the photo-diode. The dark current is the amount of current that is generated when no light is incident on the photo-diode, and it is desirable that the dark current be minimized or eliminated because it reduces the sensitivity of the imaging device. Dark current is especially a problem for digital camera and camcorder applications.

In order to minimize "dark current", conventional imaging devices often utilize a specialized semiconductor process that is designed to minimize dark current in the junction of the photo-detector. For instance, the specialized process can be a CMOS process that has been optimized to minimize dark current. However, these specialized CMOS processes are often costly, and reduce yield. What is needed is an imaging device configuration that can be implemented using a conventional CMOS process, but that also minimizes dark current in the imaging device.

Prior to being digitized, the electrical energy from the photo diode array is often amplified with an analog amplifier. In consumer applications (such as cameras, etc.), the photo diode array has several operating modes such as reset, etc. Each of these operating modes causes different loading and bandwidth requirements on the analog amplifier. However, the analog amplifier must remain stable across these various operating modes. Accordingly, what is needed is analog amplifier that is configured to remain stable across the various operating modes of a digital imaging device, while also maximizing gain and bandwidth.

Further, over-exposure or saturation can occur when relatively bright sources of light are captured next to darker sources of light. When using multiple photo-diodes, it is possible for the output of one photo-diode (or a group of photo-diodes) to capture sufficiently bright light to saturate another photo-diode or group of photo-diodes, which degrades the overall image captured.

Conventional digital cameras utilize back-end software algorithms to address this saturation problem. However, these software tools tend to slow the operation of the digital camera due to the calibration period that is required.

Therefore, what is needed is a digital imaging device that can prevent over exposure at the hardware level to improve speed and bandwidth of the digital optical device.

BRIEF SUMMARY OF THE INVENTION

The present invention includes an active pixel sensor that detects optical energy and generates an analog output that is proportional to the optical energy. In embodiments, the active pixel sensor can be implemented in a standard CMOS process, without the need for a specialized optical process.

The active pixel sensor includes a reset FET, a photo-diode, a source follower, an operational amplifier, and a current source. The photo-diode is coupled to the source of the reset FET at a discharge node. The drain of the reset FET is coupled to a power supply VDD. The discharge node is also coupled to the gate input of the source follower, the output of which is coupled to an output node through the operational amplifier. In embodiments, shallow trench isolation is inserted between the active devices that constitute the photo-diode, source follower, or the current source, where the shallow trench isolation reduces leakage current between these devices. Further, poly and metal layer crossings are minimized near the active region edges. As a result, dark current is reduced and overall sensitivity is improved. For example, shallow trench isolation reduces the leakage from pixel to pixel as well as from pixel to substrate (by making minimal bends). Leakage reduction from pixel to substrate improves sensitivity and leakage reduction from pixel to pixel reduces "blooming" (coupling of light from one pixel to the next). This enables the active pixel sensor to be integrated on a single substrate fabricated with conventional CMOS processing.

In embodiments, the active pixel sensor operates in a number of different modes including: signal integration mode, the reset integration mode, column reset mode, and column signal readout mode. Each mode causes the operational amplifier to see a different output load. Accordingly, the operational amplifier includes a variable feedback circuit to provide compensation that provides sufficient amplifier stability for each operating mode of the active pixel sensor. For instance, the operational amplifier includes a bank of feedback capacitors, one or more of which are selected based on the operating mode to provide sufficient phase margin for stability, but also considering gain and bandwidth requirements of the operating mode.

Furthermore, in embodiments, the operational amplifier also includes internal and external pre-charging circuits that pre-charge the output stage of the operational amplifier to improve slew rate performance.

As a result, the substrate area and associated costs per chip are reduced.

In embodiments, an array of photo-diodes are arranged in a number of columns to form an imaging device on the common CMOS substrate. A plurality of amplifiers and analog to digital converters (ADCs), corresponding to the plurality of columns of photo-diodes, are arranged on the substrate to form active pixel sensors. Each amplifier has an input coupled to outputs of the photo-diodes in the corresponding column. Each ADC includes one or more reference capacitors that are configured so that the corresponding reference capacitors for different ADCs are substantially equal across said substrate. The use of multiple columns of active pixel sensors improves bandwidth, and the minimal capacitance variation across the substrate minimizes image streaking and variation.

In embodiments, the outputs of the multiple pixel sensors, or photo-diodes, are examined to determine if a one pixel, or a region of pixels are in saturation. If so, then the pixel gain is adjusted to correct or compensate for the image distortion in the region. For example, the gain of the charging amplifier or operational amplifier can be adjusted.

In embodiments, a high resolution integrated circuit camera can be implemented using the optical features discussed herein. For example, a 2 Megabyte moving picture camera with no moving parts can be implemented. A large SRAM is used to processes images captured by a CMOS photo sensor array that is integrated on a chip that performs all other camera operational and user interface functions. The large SRAM operates as a buffer for further signal processing.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
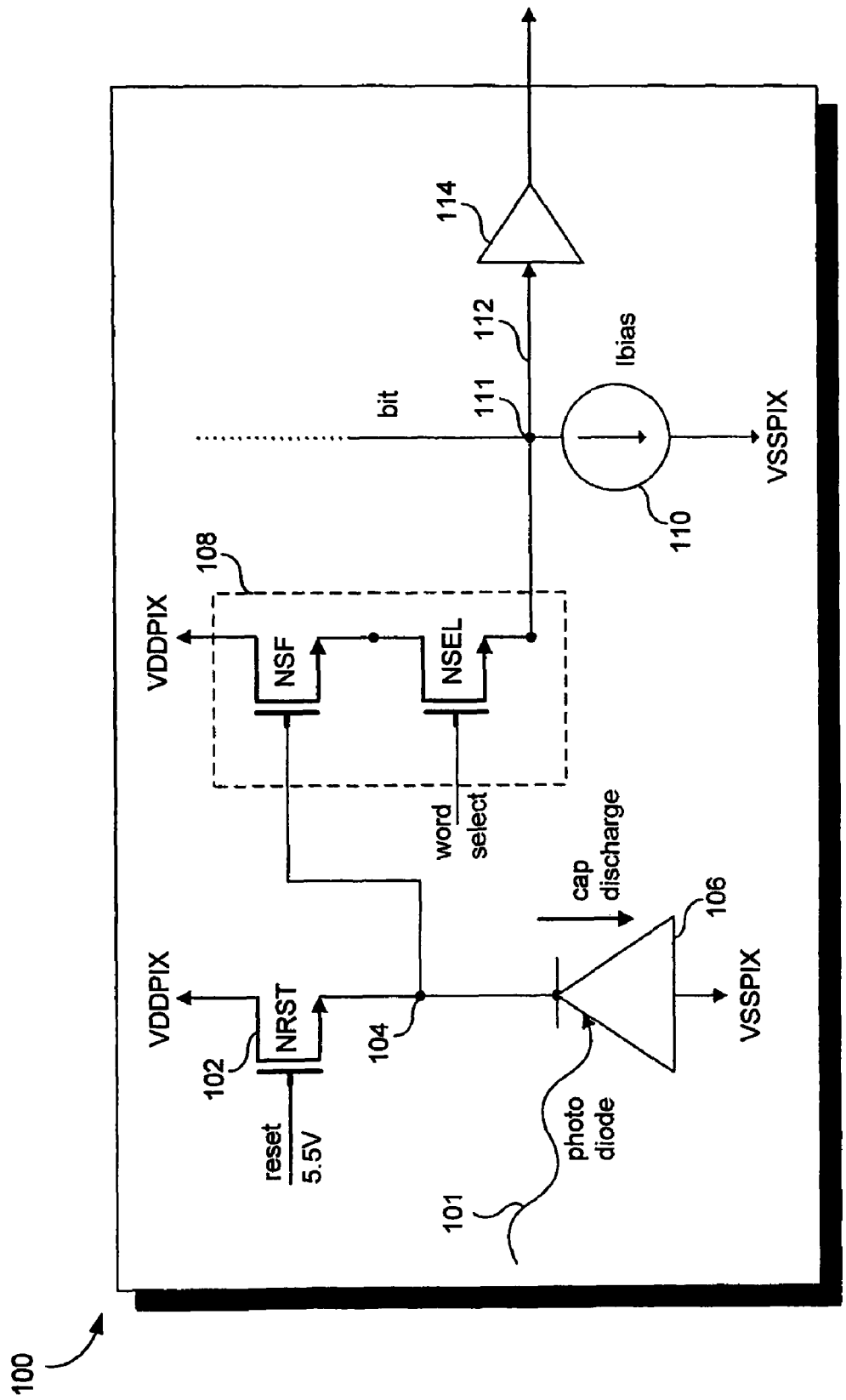
FIG. 1 illustrates a CMOS based active pixel sensor.

FIG. 1 illustrates an active pixel sensor 100 that detects optical energy 101 and generates an analog output 112 that is proportional to the optical energy 101. In embodiments, the active pixel sensor 100 can be implemented in a standard CMOS process, without the need for a specialized optical process.

The active pixel sensor 100 includes a reset FET 102, a photo-diode 106, a source follower 108, a current source 110, an amplifier 114, and an analog-to-digital converter 116. The photo-diode 106 is coupled to the source of the reset FET 102 at a discharge node 104. The drain of the reset FET 102 is coupled to a power supply VDD. The node 104 is also coupled to the gate input of the source follower 108, the output of which is coupled to output node 111.

During operation, the reset FET 102 is reset so as to charge the node 104 to VDD. More specifically, the FET 102 is turned-on using the gate input so that the node 104 charges to VDD, after which the FET 104 is cut-off, so that the node 104 is floating. When light 101 is received, the photo-diode 106 activates and discharges the node 104. The photo-diode can be a deep n-well or n-well device. The source follower 108 detects any voltages changes in the node 104 and replicates the voltage change at the output 111 to produce the analog output 112. The analog output 112 is further provided to the amplifier 114 for further processing and analog-to-digital conversion by the A/D converter 116. The current source 110 provides a bias current to the source follower 108. The active pixel sensor is typically reset for each image frame that is read using the reset FET 102.

Any leakage current that flows through the photo-diode 106 without light input will discharge the node 104, and therefore reduce the sensitivity of the active pixel sensor 100. In other words, this leakage current (or "dark current") can interfere with the voltage discharge that is associated with low energy light 101, so as to reduce the sensitivity of the active pixel sensor 100.

Further, any leakage current through the gate oxide of the reset FET 102 will also contribute to dark current that reduces sensitivity.

Conventionally, a specialized CMOS process is utilized to minimize dark current. However, in embodiments of the invention, the active pixel sensor 100 is implemented using a conventional CMOS process, even for the photo-diode 106. This enables the entire active pixel sensor 100 to be implemented on a single, common, CMOS substrate, which saves cost and integration time. To do so, the active pixel sensor 100 is configured to minimize bends and stresses in and around the photo-diode 106 and the other devices. For example, shallow trench isolation (STI) can be used to isolate active devices in the active pixel sensor 100. It has been found that minimizing bends and stresses of the metal layout in and around any Shallow Trench Isolation (STI) tends to reduce leakage current between active devices, as discussed further below.

Figure 2:
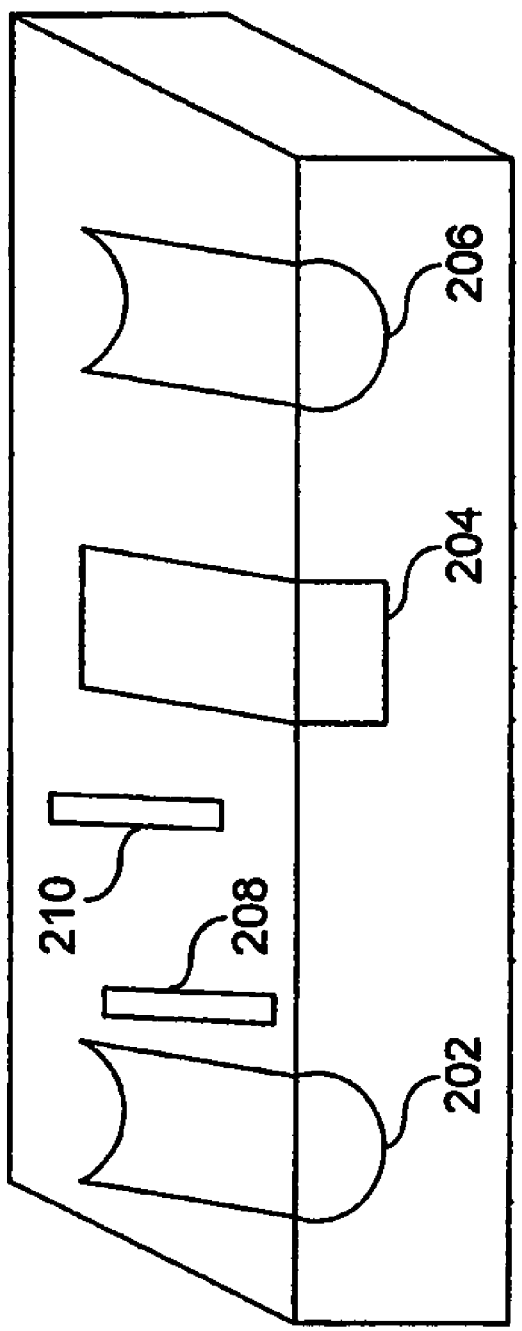
FIG. 2 illustrates active device isolation in the active pixel sensor using shallow trench isolation.

For example, FIG. 2 illustrates a shallow trench isolation (STI) 204 that is configured between first and second active devices 202 and 206 in the active pixel sensor 100. The active devices 202 and 206 can represent any one of the devices used in the reset FET 102, the photo-diode 106, or the source follower 108, etc. The active devices 202 and 206 are separated by the shallow trench isolation 204. The shallow trench isolation 204 isolates the active devices 202 and 206 from each other so as to limit leakage current between these devices. In embodiments, the shallow trench isolation 204 is an oxide filled trench that prevents charge carriers from passing between the active devices 202 and 206.

Metal traces 208 and 210 are representative of metal traces that are in and around the active devices 202 and 206, and the shallow trench isolation 204. The metal traces 208 and 210 are configured so as to minimize bends and stresses that are in and around the shallow trench isolation 204. This reduces surface currents that could bypass the shallow trench isolation 204, and therefore improves isolation between the active devices 202 and 206. Further, poly and metal layer crossings are minimized near the active region edges. The improved isolation between the active devices 202 and 206 results in lower dark current, and improved sensitivity for the active pixel sensor 100. For example, shallow trench isolation reduces the leakage from pixel-to-pixel as well as from pixel-to-substrate (by making minimal bends). Leakage reduction from pixel-to-substrate improves sensitivity and leakage reduction from pixel-to-pixel reduces "blooming" (coupling of light from one pixel to the next). It is noted that the lower dark current is achieved even when using a standard CMOS process. Therefore, the photo diode 106 and supporting circuitry can be integrated on a single CMOS substrate fabricated with a standard CMOS process.

The active pixel sensor 100 can be implemented in various consumer applications such as an optical mouse, a digital camera, or another type of optical device. Accordingly, the active pixel sensor 100 has several operating modes including signal integration, reset integration, column reset, column signal readout, etc. Each of the operating modes has different loading and bandwidth requirements. For example, bit-line integration speed is not as important as signal readout speed that is crucial for a good frame rate. However, it is important for the amplifier 114 to be stable (i.e. not oscillate) in each of these modes. However, since the amplifier loading varies with the operating modes, it is preferable that the stability compensation for the amplifier be optimized for each operational mode. In other words, it is preferable that the gain and bandwidth not be limited for all of the modes in order to insure stability for the worst case loading condition.

Figure 3A:
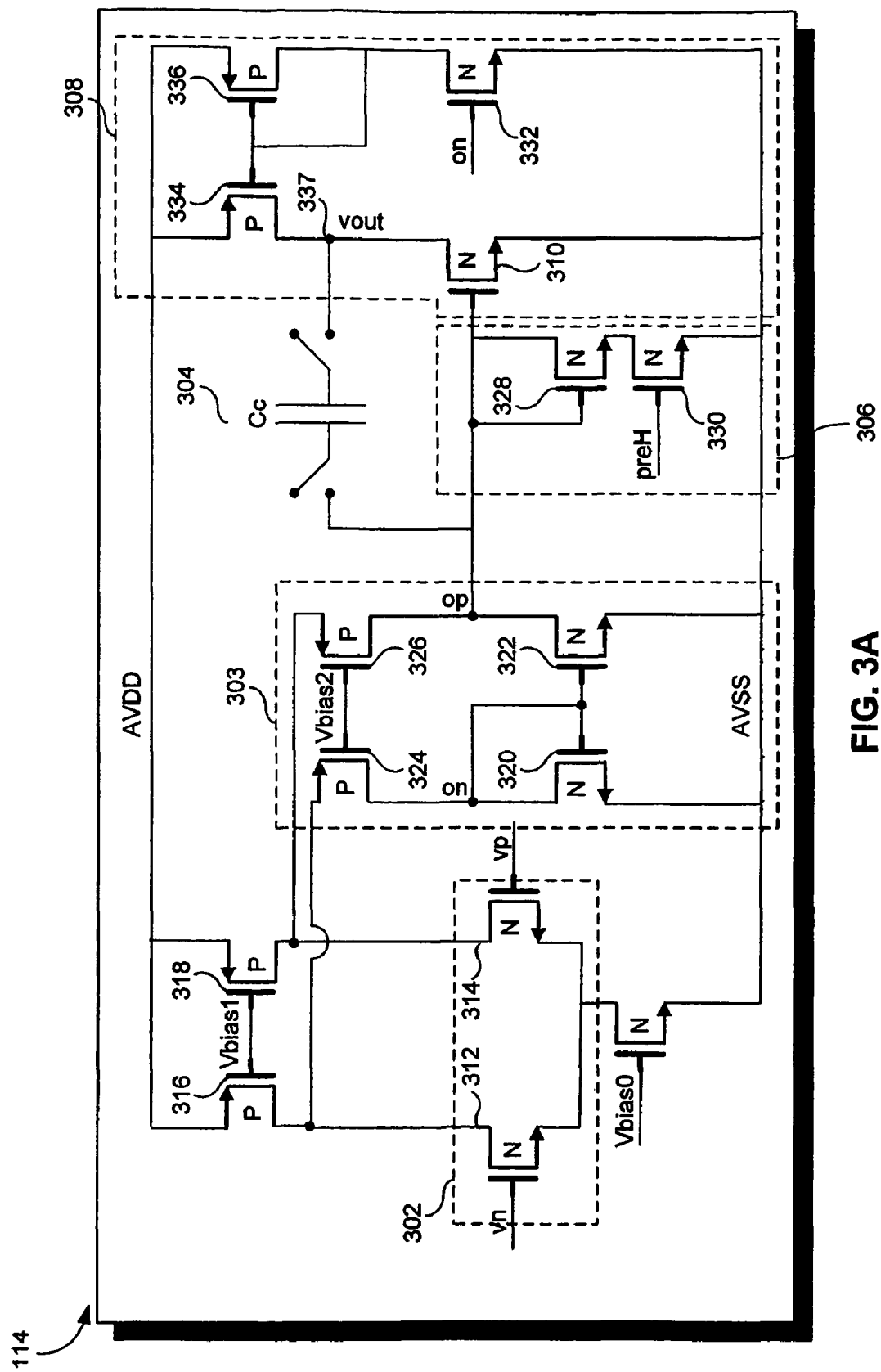
FIG. 3A illustrates an operational amplifier for the active pixel sensor with variable compensation feedback for stability concerns.

FIG. 3A illustrates an example of the amplifier 114 according to embodiments of the present invention. FIG. 3A illustrates the amplifier 114 as a two-stage operational amplifier having a first amplifier stage 302, a second amplifier stage 303, a compensation capacitor bank 304, an internal pre-charging circuit 306, and an output stage 308.

Referring to FIG. 3A, the first amplifier stage includes input transistors 312 and 314 that receive a differential input signal 112 from FIG. 1 for amplification. The input transistors 312 and 314 are connected to a cascode load formed by transistors 316 and 318. Specifically, the drains of transistors 312 and 314 are connected to the corresponding drains of transistor 316 and 318.

The second amplifier stage 303 receives the amplified output from the first amplifier stage 302, and provides a second stage of amplification and improved voltage headroom for the output of the first stage 302. In doing so, the second stage 303 includes transistors 324 and 326 that receive the differential output from the first stage 302 and transistors 320 and 322 connected to the respective drains of transistors 324 and 326.

The output (or third) amplifier stage 308 has an input coupled to the output of the second amplifier stage 303, and to the compensation capacitor bank 304, and to the pre-charge circuit 306. Specifically, transistor 310 in the output stage 308 receives the output of the second stage 303. The output stage 308 further includes transistors 334 and 336 connected to the drain transistor 310, and transistor 332. The output circuit provides output signal buffering and provides the amplified output at node 337. The operation of the compensation capacitor 304 and the pre-charging circuit 306 are described further below.

The compensation capacitor bank 304 includes a plurality of capacitors that provide an internal feedback path for the amplifier 114 from the output 337. The capacitor bank 304 is configured to provide adequate phase margin for each of the operating modes in the active pixel sensor 100. In other words, one or more of the capacitors in the compensation capacitor bank 304 are selected to provide adequate phase margin for stability based on the output load conditions of the amplifier 114. For example, different capacitor settings may be selected for the operating modes (signal integration, reset integration, column reset, column signal readout) to provide sufficient stability, while also maximizing bandwidth for each of the operating modes.

As discussed above, the phase margin requirements that are required to insure amplifier stability vary for each of the operating modes of the active pixel sensor 100. The tuning capability of the capacitor bank 304 enables variable feedback so that the amplifier 114 does not have to be designed for the operating mode with the worst case stability concern. This enables the bandwidth to be maximized for operating modes where stability is less of a problem.

Figure 3B:
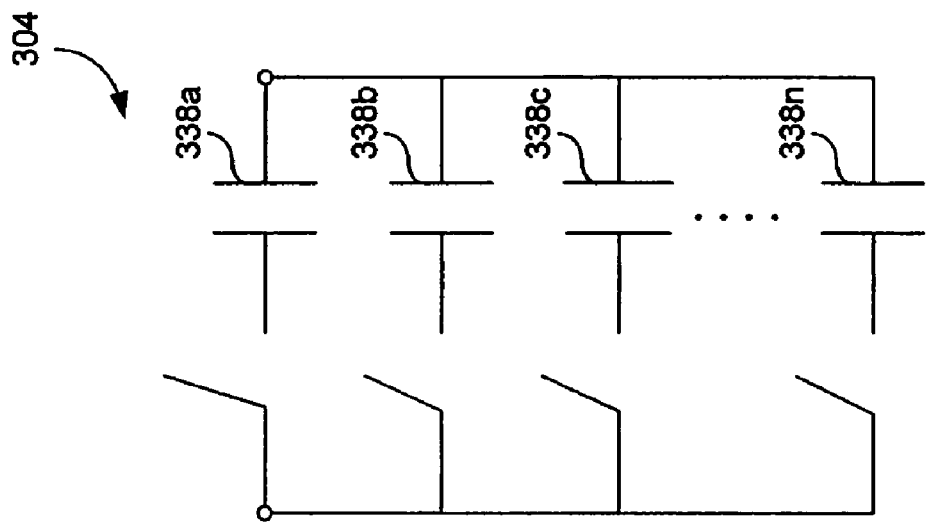
FIG. 3B further illustrates the compensation feedback of FIG. 3A.

FIG. 3B further illustrates the capacitor bank 304 for clarity, wherein one or more capacitors 338 are switched into the op amp to vary the feedback from the output stage 308. The feedback variation adjusts the gain, bandwidth, and stability of the op amp 114. Generally, more capacitive feedback reduces the gain and bandwidth of the op amp 114, but improves stability. Less capacitive feedback increases the gain and bandwidth of the op amp 114, but makes the amplifier 114 more unstable.

The op amp 114 is configured to improve the slew rate performance of the output stage 308. More specifically, pre-charge circuits are added to improve the pull-up slew-rate of the output stage 308. For example, internal pre-charge circuit 306 initializes the output stage 308 operating point to the threshold of an n-mos device. The gate of N-FET 310 is raised to the device threshold so that the device turns on faster. This raises the operating point of the output stage 308, accordingly, and improves the ability of the output stage to pull-up to a positive output voltage. In other words, it improves the slew-rate performance to enable the amplifier to pull-up to a positive output voltage.

Figure 4:
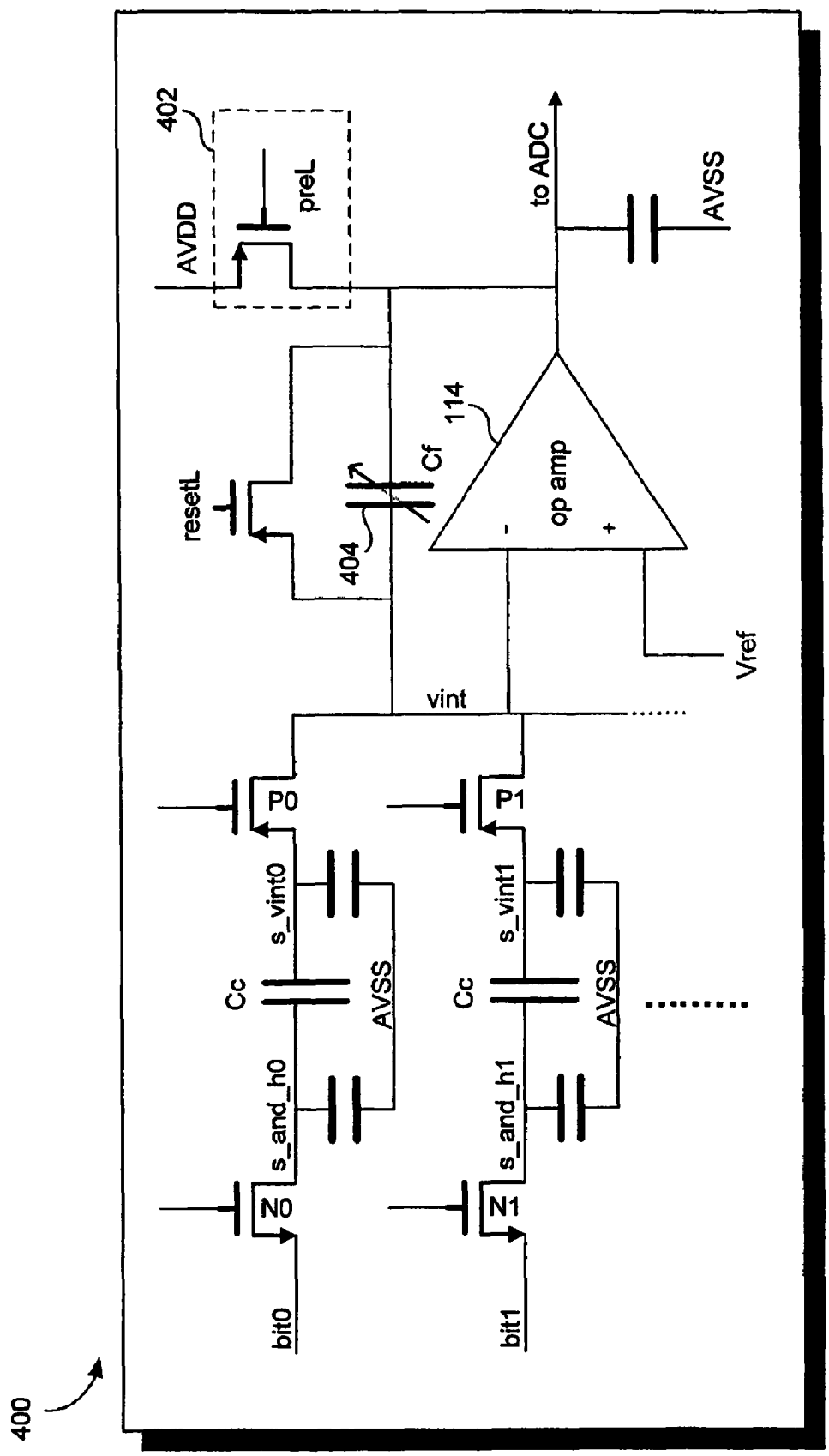
FIG. 4 illustrates the operational amplifier for the active pixel sensor with pre-charge initialization.

FIG. 4 further illustrates the configuration of the op amp 114 in a multi-bit active pixel sensor 400. As shown, a pre-charge circuit 402 is used to bias the output of the op-amp 114 close to $V_{DD}$, which improves the slew rate performance of the device. In other words, the output of the op amp 114 is biased close to the positive voltage supply rail of the op amp.

The feedback capacitor 404 further provides for gain control by adjusting the feedback across the op amp 114, as will be discussed further below. It is noted that the capacitor 404 provides external feedback for the op amp from output to input. Whereas, the compensation capacitor 304 provides feedback internal to the op amp 114.

The operational amplifier described herein with variable compensation feedback is not limited optical imaging applications. This is only one example application. The operational amplifier described herein could be used in any application with variable loading environment, so as to maintain stability without unnecessarily sacrificing gain and bandwidth requirements.

Figure 5:
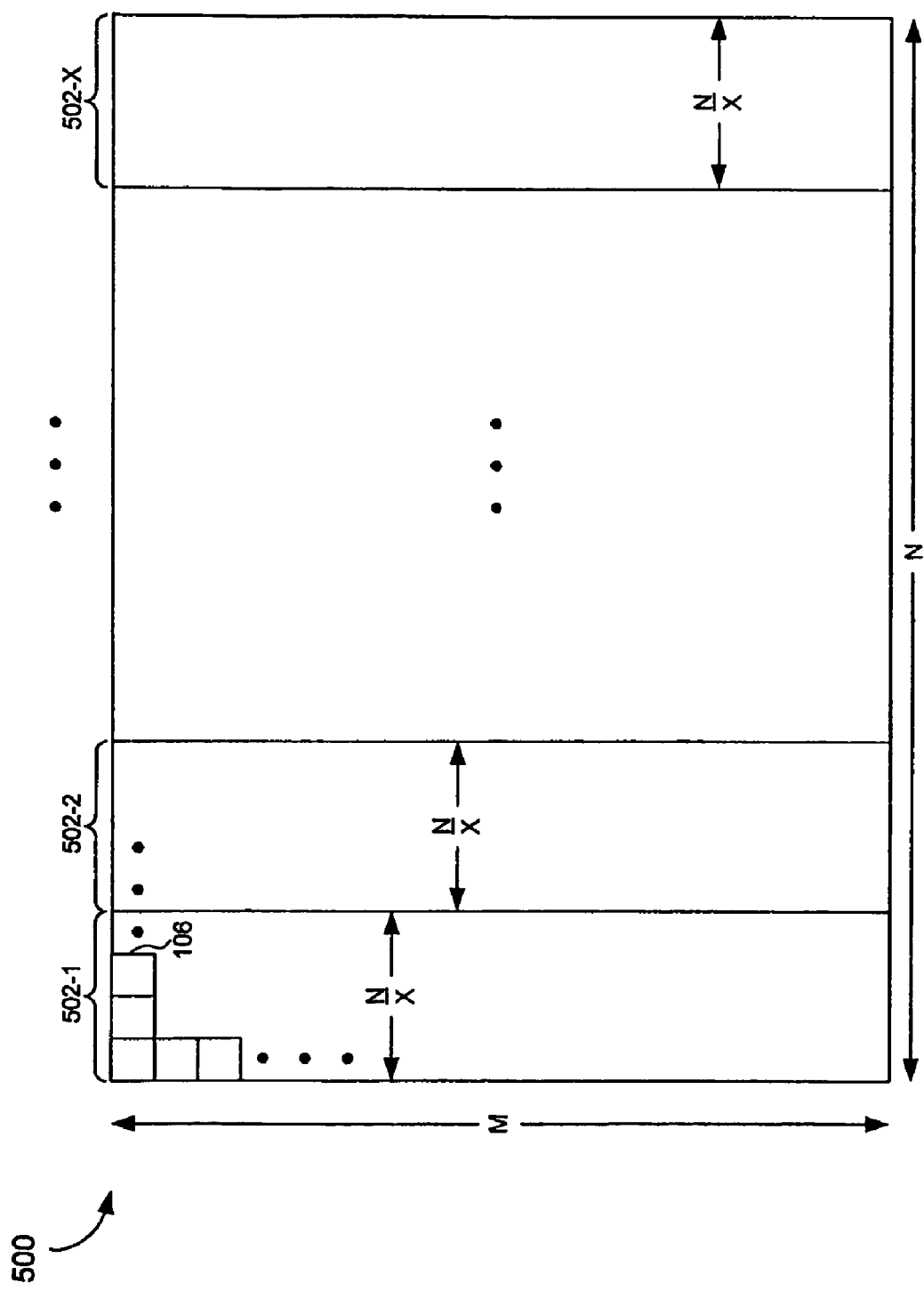
FIG. 5 illustrates an imaging device having a plurality of photo-diodes that are arranged in columns with corresponding ADCs.

FIG. 5 illustrates a CMOS imager array 500 according to embodiments of the invention that can be used for a digital camera or another digital optical device, such as an optical mouse. The CMOS imager array 500 includes an array of photo-diodes 106 that can be referred to as picture elements (pixels), since they represent individual pixels in an image. The CMOS imager array 500 is arranged in a number of columns (e.g., N columns) and rows (e.g., M rows) of the pixels 106. For example, the CMOS imager array 500 can include 672 columns by 480 rows of pixels 106. The pixels 106 can be arranged in a number of columns, (e.g., X columns, shown in FIG. 5 as columns 502-1, 502-2 . . . 502-X) where the output of each column is coupled to a single charging amplifier and a single ADC. In other words, the outputs of columns 502-1 through 502-X are each connected to a separate charging amplifier 114 and ADC 116. For example, the CMOS imager array 500 can be arranged into 6 columns, so that each column contains 112 (N/X=672/6=112) pixels 106 in a row.

In optical mouse application, the pixel array is very small (typically 30×30) so the pixel size is not very important. This is crucial since if we use the standard CMOS process, then a microlens is not used on top of the chip which is used to concentrate light onto the tiny pixel. Due to the absence of microlens, the pixel is much larger than for a digital camera (or camcorder) applications. Impact on cost is minimal and there are cost savings using standard CMOS anyways.

Figure 6:
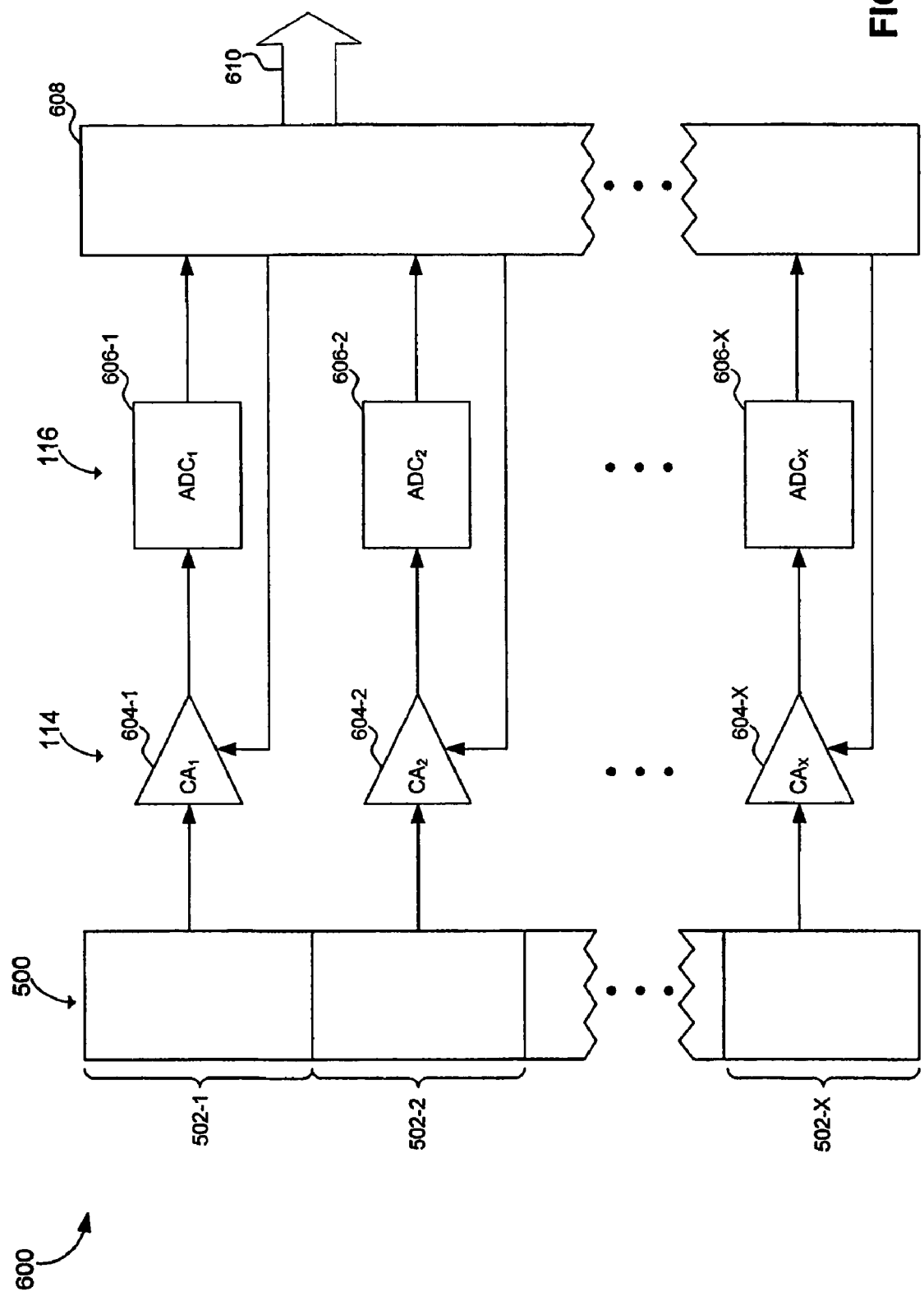
FIG. 6 further illustrates the imaging device with an array of photo-diodes and supporting circuitry.

FIG. 6 illustrates an imaging device 600 having a CMOS imager array 500 and supporting circuitry for improved image processing, according to the present invention. As shown in FIG. 6, each column of the CMOS imager array 500 (columns 502-1 through 502-X) is coupled to a corresponding charge amplifier (604-1 through 604-X) and ADC (606-1 through 606-X). The charge amplifiers 604-1 through 604-X correspond to the charge amplifier 114 depicted in FIG. 1. The ADCs 606-1 through 606-X correspond to the ADC 116 depicted in FIG. 1. The outputs of ADCs 606-1 through 606-X are provided to an imager array controller 608. The output of the image array controller 608 is a digital image signal 610 representing the actual image initially detected by the array of pixels 106 that form the CMOS imager array 500. Connections to the charge amplifiers 604-1 through 604-X are used to adjust the operation of the charge amplifiers 604-1 through 604-X by the imager array controller 608. In other words, the controller 608 provides feedback to adjust the charge amplifiers 604-1 through 604-X.

Configuring the CMOS image array 500 into a number of columns improves the bandwidth of the imaging device 600 compared to connecting all of the pixels 106 (not shown in FIG. 6) to a single charging amplifier and a single ADC. The improved bandwidth occurs because the pixel data of the columns 502-1 through 502-X is processed in parallel resulting in multiple streams of data being processed in parallel. Note that the invention is not limited to the number of pixels and columns that are shown herein. In other words, any number of pixels 106 can be used, and this can be divided into any number of columns. Additionally, the columns can be further sub-divided so that multiple charging amplifiers 604 and ADCs 606 are used for each column to create a two dimensional array of amplifiers and ADCs. Accordingly, the gain of groups of pixels 106 or even a single pixel can be adjusted as will be discussed below.

The ADCs 606-1 through 606-X should be matched so as to exhibit substantially the same characteristics during operation. That is, the variation of the ADCs 606-1 through 606-X should be eliminated or minimized to reduce any difference among the quantization functions of the ADCs 606-1 through 606-X. When the ADCs 606-1 through 606-X are not matched, the image digital image signal 610 that is produced may have an undesirable "streaking" effect caused by the different quantization functions of the ADCs 606-1 through 606-X. The "streaking" effect can be represented by one column appearing to be a light or dark variation compared to an adjacent column or columns. Overall, any mismatch between the ADCs 606-1 though 606-X reduces the quality of the digital image signal 610.

Figure 7:
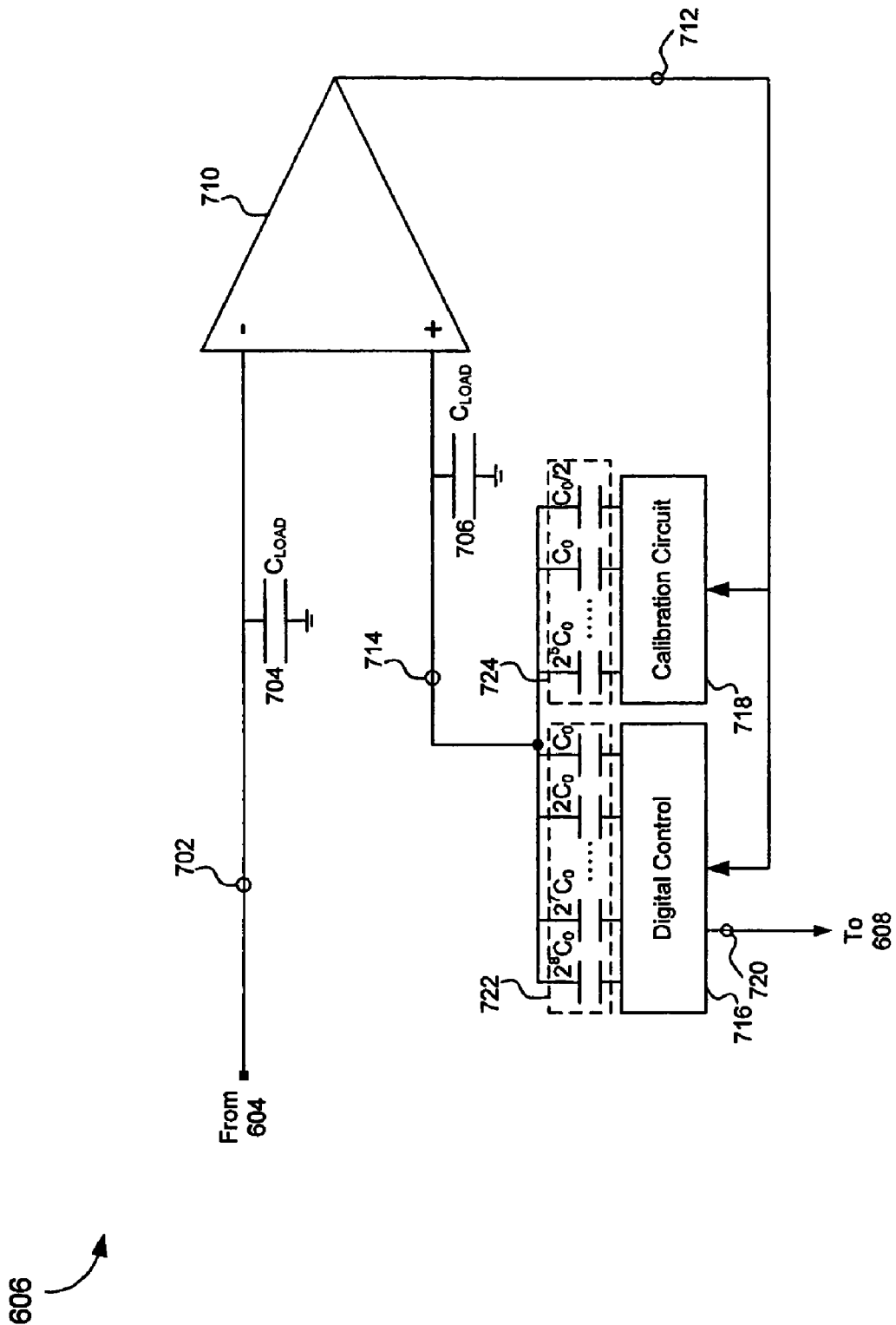
FIG. 7 illustrates a successive approximation ADC.

FIG. 7 illustrates a matched ADC 606 that reduces ADC variation according to the present invention. Specifically, FIG. 7 illustrates the ADC 606 as a successive approximation ADC. The ADC includes a comparator 710, a digital control 716, a calibration circuit 718, a digital control capacitor bank 722, and a calibration circuit capacitor bank 724. The capacitors within the digital control capacitor bank 722 and the calibration circuit capacitor bank 724 can be implemented as various types of capacitors, including interdigitated metal finger capacitors and planar capacitors. The inverting input of the comparator 710 is coupled to the output of the preceding charge amplifier 604. The inverting input of the comparator 710 receives a reference signal 702 from the charge amplifier 604. The reference signal 702 from the charge amplifier 604 is an analog signal that the ADC 606 converts into a digital representation 720. A capacitor 704 is coupled to the non-inverting input of the comparator 710. The capacitor 704 reduces noise on the reference signal 702 from the charge amplifier 604.

As further shown in FIG. 7, an approximation signal 714 is generated by the ADC 606. The approximation signal 714 is provided to the non-inverting input of the comparator 710. The comparator 710 compares the reference signal 702 to the approximation signal 714 and generates a difference signal 712. The difference signal is used by the digital control 716 to adjust the approximation signal 714. The output of the ADC 606 is the digital representation 720. The digital representation 720 includes the bits which are used to digitally represent the reference signal 702. The digital representation 720 is passed to the imager array controller 608.

The digital control capacitor bank 722 is used to generate and modify the approximation signal 714. The digital control capacitor bank 722 includes a number of binary-scaled capacitors arranged in a voltage divider network. A capacitor 706 coupled to the non-inverting input of the comparator 710 determines the voltage divider ratio (i.e., amplitude of one bit) of the voltage divider network. The binary-scaled capacitors are successively switched between a reference voltage or ground. During iterative adjustments to the approximation signal 714, only one capacitor within the digital control capacitor bank 722 is switched. The capacitors are switched from largest to smallest, corresponding with setting the digital representation 720 from most significant bit (MSB) to least significant bit (LSB). The number of capacitors within the digital control capacitor bank 722 determines the number of iterations used to successively approximate the reference signal 702. Consequently, the number of capacitors within the digital control capacitor bank 722 also determines the number of bits within the digital representation 720. In embodiments, 9 capacitors, and therefore 9 bits, are used to generate the approximation signal 714 and form the digital representation 720.

Each of the capacitors within the digital control capacitor bank 722 is based on a reference capacitor $C_0$. That is, each capacitor within the digital control capacitor bank 722 is a binary-scaled version of the reference capacitor $C_0$. The linearity of ADC 606 is determined by the matching of the capacitors within the digital control capacitor bank 722. The capacitors within the digital control capacitor bank 722 of each ADC 606 can vary over a large substrate. This capacitor variation is simply a result of process variations over the surface of a silicon substrate. Referring to FIG. 6, the capacitor variation can cause the ADCs 606-1 through 606-X to be mismatched. In turn, the quantization functions of the ADCs 606-1 though 606-X can vary. Accordingly, it is desirable to limit capacitor variation over the surface of the CMOS image array to minimize or eliminate image variation or streaking.

In embodiments, a minimum capacitance value $C_0$ is provided for the capacitors within the digital control capacitor bank 722 to minimize the ADC variation described above. More specifically, if the reference capacitor $C_0$ is larger than a minimum value, then the foundry that manufactures the CMOS image array can specify a maximum variation of the capacitors across the substrate, or provide matching data for a given capacitor size and/or type. This matching data can be used to minimize the variation of corresponding capacitors of the ADCs 606-1 through 606-X over the substrate. This can be done by compensating the capacitors across the substrate with layout or metal tuning so that the variation across the substrate is minimized or eliminated.

For example, the fab provides matching data for capacitors implemented with certain metal width and spacing. From this matching data, the minimum $C_0$ is determined so that matching is at least ½ bit or better (for an 8-bit converter, this would be better than 1 in 512). The layout is made symmetric and regular (identical $C_0$ capacitor repeating many times). For example, $2 \times C_0$ capacitance is the original $C_0$ layout repeated twice so as to accurately produce the $2 \times C_0$ capacitance. A large array is formed this way with dummy capacitors at the edges ($C_0$ cap layouts that are not used for matched ADC application). The capacitors are formed as physically close to each other as possible and the layout is made identical (both the cap itself and its neighboring regions). As a result, the present invention provides matched ADCs 606-1 through 606-X having similar quantization functions.

In embodiments, a 9 bit ADC 606 uses 1024 quantization levels. To reduce the statistical variation of the ADCs 606-1 through 606-X to less than ½ bit, the matching between the capacitors within the digital control capacitor bank 722 is made to be better than 1 in 1024. Accordingly, to reduce the statistical variation of the ADCs 606-1 through 606-X to less than ¼ bit, the matching between the capacitors within each digital control capacitor bank 722 is made to be better than 1 in 2048. The matching data provided by the foundry and the selection of the reference capacitor $C_0$ ensures a desired minimum ADC 606 variation. Essentially, the matching data provided by the foundry is based on a manufacturing tolerance.

In embodiments of the present invention, the ADC 606 uses the calibration circuit 718 and the calibration circuit capacitor bank 724 to reduce a voltage offset between the approximation signal 714 and the reference signal 702. The calibration circuit capacitor bank 724 also includes a number of binary-scaled capacitors based on the reference capacitor $C_0$ arranged in a voltage divider network. For example, the calibration circuit capacitor bank 724 can include 6 capacitors. The capacitors within the calibration circuit capacitor bank 724 are switched between the reference voltage or ground to place an offset voltage onto the non-inverting input of the comparator 710. The calibration circuit capacitor bank 724 shown in FIG. 7 is not limited to using fewer constituent capacitors than the digital control capacitor bank 722.

In embodiments, the CMOS imager array 700 is configured to process color images including, for example, green, red, and blue light. To do so, typically, 50% of the pixels 106 are configured to process green light, 25% process red light, and 25% process blue light. When using multiple columns 702-1 through 702-X and corresponding ADCs 606-1 through 606-X for improved bandwidth, it is important for the ADC variation to be minimized across the CMOS imager array 700. In one embodiment, three such ADCs are used for processing green color signals and three additional such ADCs are used to process red and blue, without perceivable image artifacts.

It is important to note that the same color pixels go through the same physical hardware (Charge amplifier & ADC). For example, the green channel might be at the bottom of the array and the red/blue channel might be at the top of the array. If a color is split between these two top/bottom ADC's you might see more mismatch due to the physical distance separation on the chip. Putting all the same-color pixels through the same hardware reduces any artifacts due to mismatch or exact channel gain etc. This is important since the gain might not be as carefully controlled in some applications as the ADC matching.

A problem can occur in digital imaging devices where the pixels (e.g., photo-diodes) in one region of the CMOS array 500 saturate with bright light, and distort the resulting image.

Figure 8:
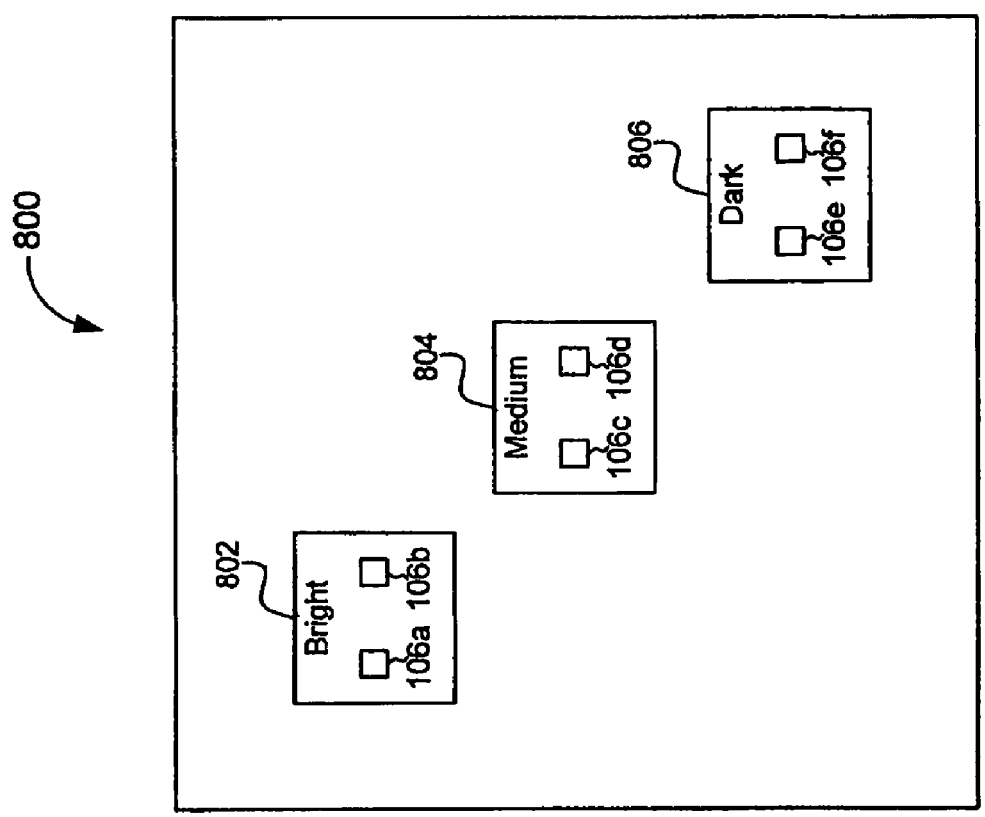
FIG. 8 illustrates a pixel array 800 having regions of brightness.

For example, FIG. 8 illustrates an N×N array 800 of pixels having 3 regions 802, 804, and 806 of the pixels 106. The region 802 is indicated as processing relatively bright light, the region 804 is indicated as processing medium light, and the region 806 is indicated as processing dark light. If a single amplifier and ADC were used the process the image from the array 800, then the bright region 802 could saturate the entire resulting image.

Fortunately, the above mentioned problem can be addressed by adjusting the gains of the charging amplifiers 604 and ADCs 606 to compensate for the relative intensity of the light in the different regions of CMOS array of pixels. In order to do so, each region 802, 804, and 806 requires its own charging amplifier that can be gain adjusted. For example, in the region 802, the corresponding charging amplifier(s) 604 can be adjusted so as to reduce the gain and mitigate the effect of the high intensity input. In the region 804, the corresponding charging amplifier(s) are adjusted to account for a medium intensity input. In the region 806, the corresponding charging amplifier(s) 604 can be adjusted to increase the gain to boost the dark light input. In summary, the gain for groups of pixels 106, or even a single pixel 106, can be adjusted so as to mitigate saturation effects of the array 800.

Referring back to FIGS. 3A, 3B, and 4, the gain adjustment can be accomplished by adjusting the gain of the operational amplifier 114. For example, the feedback capacitor $C_f$ 404 (FIG. 4) can be adjusted to raise or lower the gain of the operational amplifier 114, and thereby adjust the gain of a pixel 106 or a group of pixels 106. It is noteworthy that the gain adjustment is done in analog hardware, as opposed to software, which improves bandwidth and the speed of the adjustment. Whereas, software corrections occur after the fact, and once saturation occurs information is already lost. Accordingly, the present invention prevents saturation from occurring and improves image quality.

Figure 11:
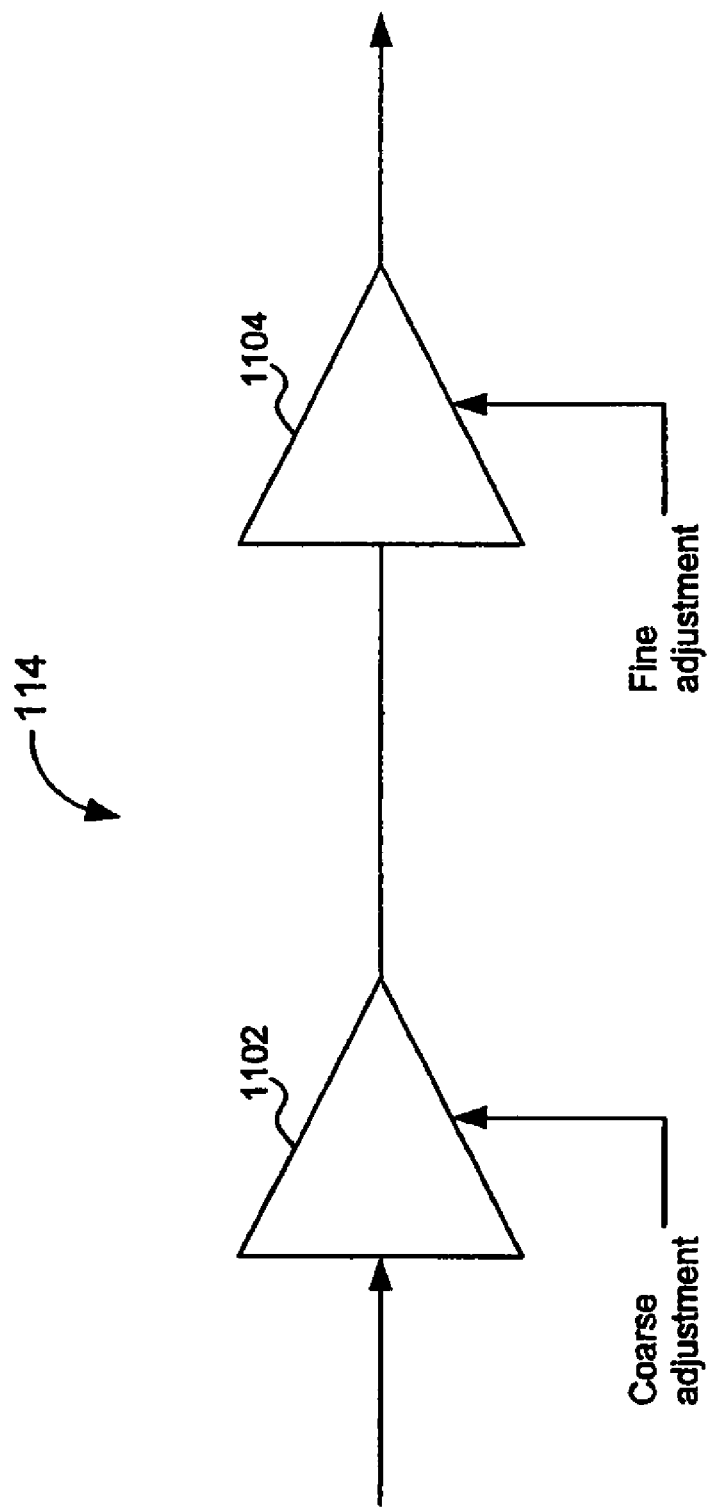
FIG. 11 illustrates coarse and fine adjustment using a charging amplifier.

In embodiments, two op amps are used for gain adjustment. In other words, op amp 114 includes first and second op amps 1102 and 1104 as shown in FIG. 11. Op amp 1102 performs a coarse gain adjustment and the other op amp 1104 performs a fine gain adjustment. The coarse adjustment can be performed during a calibration period, and the fine adjustment can be performed during the real-time image processing.

The operation of the array 500 can be optimized by implementing a calibration phase, prior to processing the actual optical data. For instance, during the calibration phase, the array 500 can receive an optical image and correct any potential saturation, or over exposure, by adjusting the gain of the operational amplifier or amplifiers 114 for the corresponding pixels. Referring to FIG. 6, the operational amplifiers 604 can be adjusted.

Figure 9:
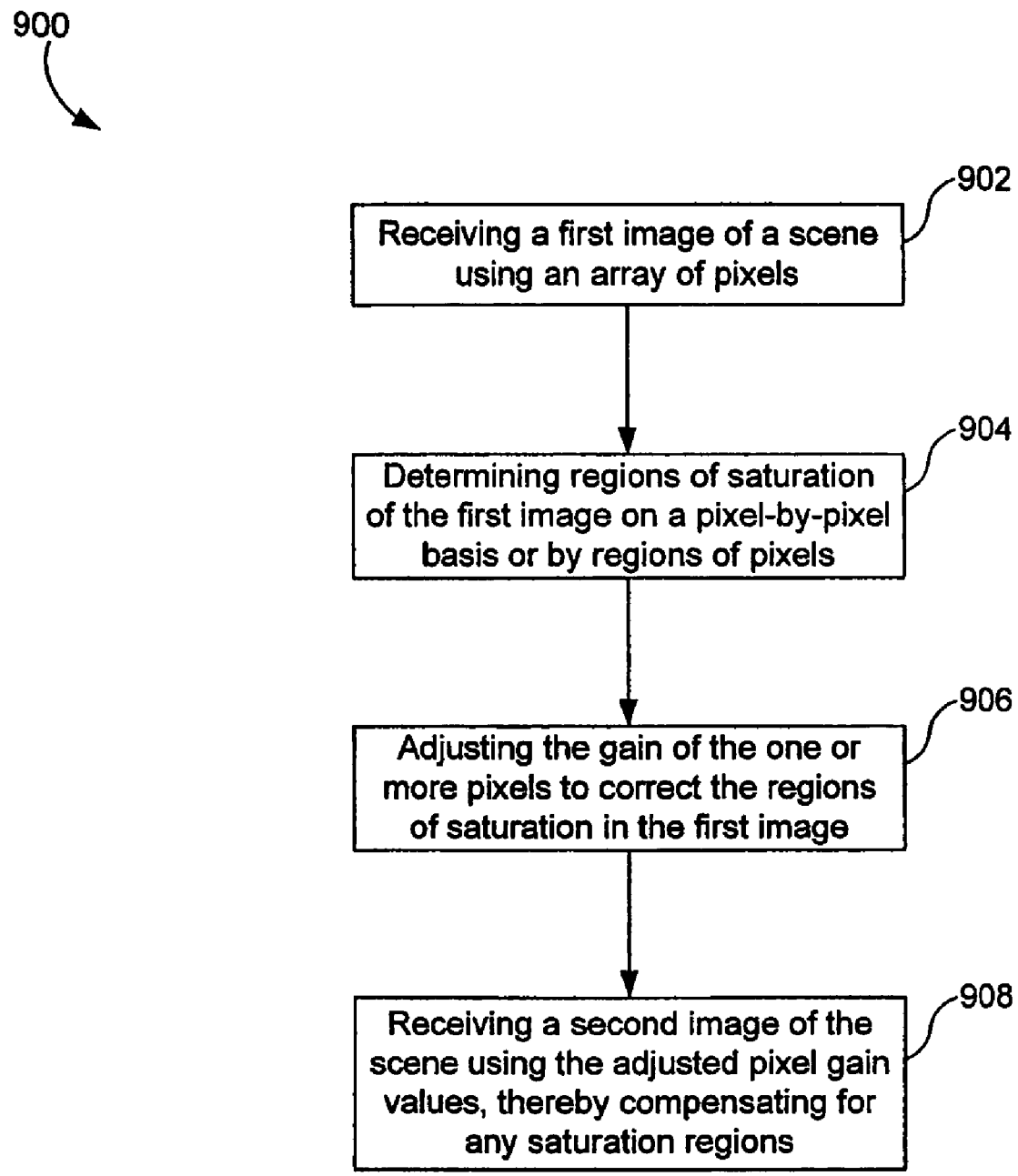
FIG. 9 illustrates a flowchart 900 for correcting regional image saturation.

This is further described in the flowchart 900 that is shown in FIG. 9, and described further below.

In step 902, a first image of a scene is received using an array of pixels. In step 904, regions of saturation of the first image are determined on a pixel-by-pixel basis or by regions or groups of pixels. In step 906, the gain of the one or more pixels is adjusted to correct the regions of saturation. In step 908, a second image of the scene is captured using the adjusted pixel gain values, thereby compensating for any saturation regions.

In embodiments, further fine gain adjustments are performed during the second image capture, whereas coarse gain adjustment is performed in the first image capture. In other words, real-time fine gain adjustments are performed during the second image capture. For example, FIG. 11 can be used for coarse and fine gain adjustments.

Figure 10:
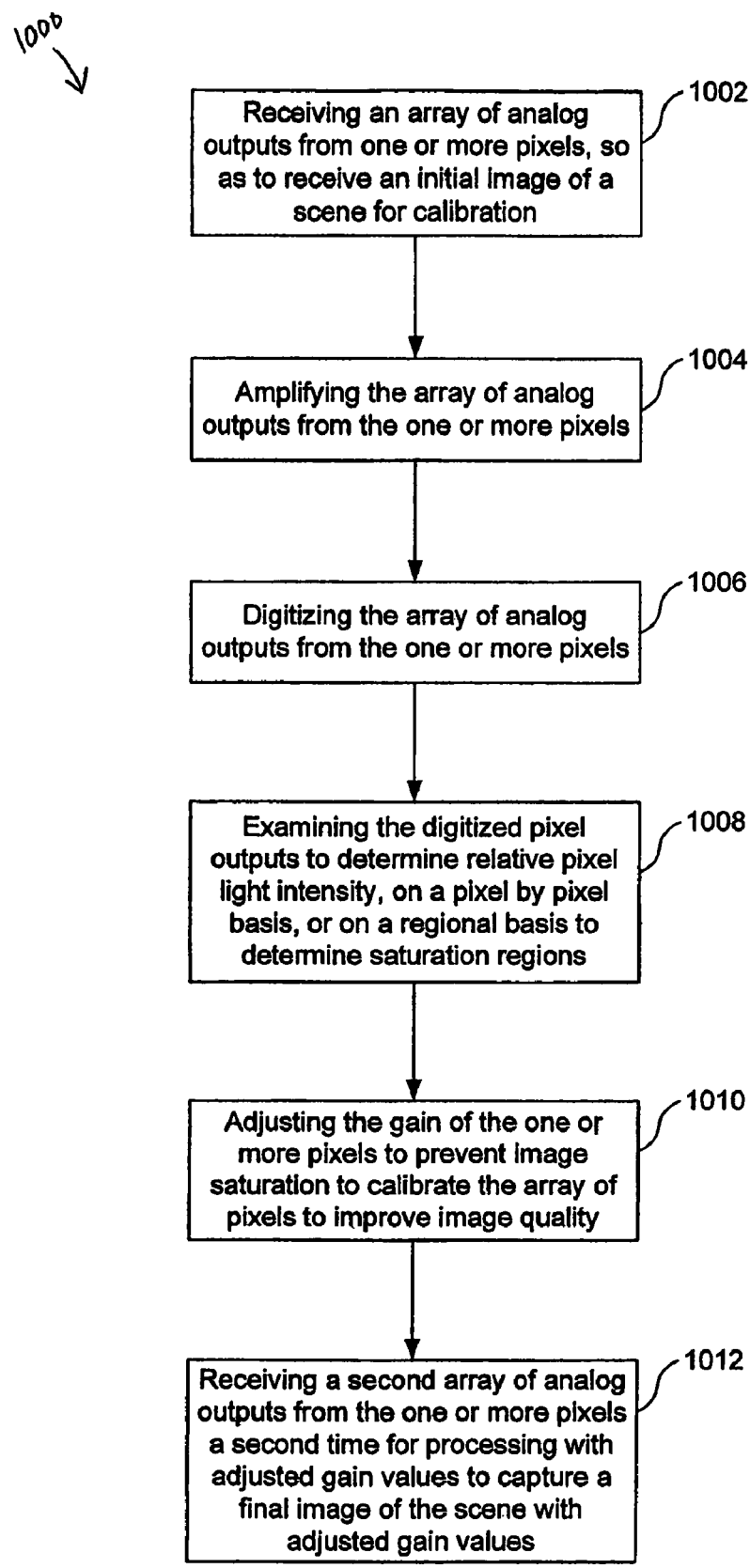
FIG. 10 illustrates a flowchart 1000 for correcting regional image saturation.

The invention is further described by the flowchart 1000 in FIG. 10. In step 1002, an array of analog outputs from one or more pixels is received. In other words, a first image of a scene is taken to determine saturation values of regions of the image. In step 1004, the array of analog outputs is amplified according to one or more gain values and corresponding amplifiers. In step 1006, the array of analog outputs is digitized using an array of ADCs. In step 1008, the digitized pixel outputs are examined to determine relative pixel light intensity, on a pixel-by-pixel basis, or on a regional basis. In other words, the digitized pixel outputs are examined to determine saturation values of regions of the image. The regions can be defined by n×n pixels, or individual pixels. In step 1010, the gain of one or more pixels is adjusted to prevent image saturation, and improve image quality. In other words, the charging amplifier gain is adjusted to prevent saturation and improve image quality. In step 1012, a second array of analog outputs from the one or more pixels is received a second time for processing with the adjusted gain values. In summary, the saturation values of each region are used to adjust the gain characteristics of each region prior to capturing a second, final image of the scene thereby avoiding over exposure of the image.

Using the optical imaging features described herein, a high resolution Integrated circuit camera can be implemented. For example, a 2 Megabyte moving picture camera with no moving parts has been proposed. A large SRAM is used to processes images captured by a CMOS photo sensor array that is integrated on a chip that performs all other camera operational and user interface functions. The large SRAM operates as a buffer for further signal processing.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An operational amplifier, comprising:
an input stage configured to receive a signal;
an output stage configured to produce an output responsive to the signal;
a feedback circuit coupled between the input stage and the output stage having a response that is adjustable based on a load coupled to the output stage; and
a pre-charging circuit configured to bias the output stage to approximately a positive supply voltage for the operational amplifier.

2. The operational amplifier of claim 1, wherein the feedback circuit includes a bank of capacitors, a subset of which is selectable based on the load coupled to the output stage.

3. The operational amplifier of claim 2, wherein the subset of selectable capacitors is selected to provide a minimum stability for a corresponding load coupled to the output stage.

4. The operational amplifier of claim 3, wherein the pre-charging circuit is configured to pre-charge the output stage of the operational amplifier to improve pull-up slew rate performance.

5. The operational amplifier of claim 1, wherein the feedback circuit is adjustable to provide a minimum stability for each of a plurality of operating modes to prevent the operational amplifier from oscillating.

6. The operational amplifier of claim 1, wherein the feedback circuit is adjustable to provide a minimum stability for a plurality of output loads coupled to the output stage to prevent the operational amplifier from oscillating.

7. An operational amplifier, comprising:
an input stage configured to receive a signal;
a feedback circuit adjustable to provide a minimum stability for a plurality of different output loads coupled to the operational amplifier to prevent the operational amplifier from oscillating; and
a pre-charging circuit configured to bias an output stage of the operational amplifier to approximately a positive supply voltage for the operational amplifier.

8. The operational amplifier of claim 7, wherein the feedback circuit comprises a bank of feedback capacitors.

9. The operational amplifier of claim 8, wherein one or more of the feedback capacitors are selected based on a corresponding output load coupled to the operational amplifier.

10. The operational amplifier of claim 9, wherein the one or more feedback capacitors are selected to provide a sufficient phase margin for stability of the operational amplifier such that the operational amplifier does not oscillate when coupled to the corresponding output load.

11. The operational amplifier of claim 9, wherein the one or more feedback capacitors are selected based on gain and bandwidth requirements of the corresponding output load.

12. An operational amplifier comprising:
a first amplifier stage configured to receive a signal;
a second amplifier stage coupled to an output of the first amplifier stage;
a capacitor bank;
a third amplifier stage coupled to an output of the second amplifier stage and the capacitor bank; and
a pre-charging circuit configured to bias the third amplifier stage to approximately a positive supply voltage for the operational amplifier.

13. The operational amplifier of claim 12, wherein the capacitor bank comprises a switch configured to switch a capacitor in the capacitor bank into the operational amplifier to provide a minimum stability for the operational amplifier based on an output load coupled to the third amplifier stage.

14. The operational amplifier of claim 12, wherein the capacitor bank is configured to provide adequate phase margin for the operational amplifier such that the operational amplifier does not oscillate when coupled to each of a plurality of possible output loads.

15. The operational amplifier of claim 12, wherein the capacitor bank is configured to maximize bandwidth for an output load coupled to the third amplifier stage.

16. The operational amplifier of claim 13, wherein the capacitor bank is configured to adjust the feedback from the third amplifier stage based on an output load coupled to the third amplifier stage.

17. The operational amplifier of claim 13, wherein the capacitor bank is configured to adjust the gain across the operational amplifier.

18. The operational amplifier of claim 12, wherein the pre-charging circuit is configured to improve the slew rate of the third amplifier stage.

19. The operational amplifier of claim 1, wherein the response of the feedback circuit is adjustable for a plurality of operating modes of an active pixel sensor, and wherein the load coupled to the output stage corresponds to one of the operating modes.

20. The operational amplifier of claim 7, wherein a response of the feedback circuit is adjustable for a plurality of operating modes of an active pixel sensor, and wherein each of the output loads corresponds to one of the operating modes.

* * * * *